(12) United States Patent
Rutherford et al.

(10) Patent No.: US 7,473,855 B2
(45) Date of Patent: Jan. 6, 2009

(54) HF SEALING STRIPS

(75) Inventors: Paul Rutherford, Karlsruhe (DE);
Michael Joist, Gaggenau (DE); Peter Dratwa, Unterliezheim (DE)

(73) Assignees: Schroff GmbH, Straubenhardt (DE);
MTC Micro Tech Components GmbH, Dillingen (DE)

( * ) Notice: Subject to any disclaimer, the term of this patent is extended or adjusted under 35 U.S.C. 154(b) by 288 days.

(21) Appl. No.: 11/373,506

(22) Filed: Mar. 13, 2006

(65) Prior Publication Data

US 2006/0272855 A1    Dec. 7, 2006

(30) Foreign Application Priority Data

Mar. 11, 2005    (EP)    ................... 05005343

(51) Int. Cl.
*H05K 9/00*    (2006.01)
(52) U.S. Cl. ........................ 174/356; 277/920
(58) Field of Classification Search ............... 174/356, 174/358, 357, 368, 369; 277/920; 361/816, 361/818
See application file for complete search history.

(56) References Cited

U.S. PATENT DOCUMENTS

| 6,483,023 | B1 | 11/2002 | Jacques | |
| 6,653,556 | B2* | 11/2003 | Kim | 174/358 |
| 7,161,090 | B2* | 1/2007 | Mattsson et al. | 174/350 |
| 2003/0051891 | A1 | 3/2003 | Rapp et al. | |

FOREIGN PATENT DOCUMENTS

EP    1 052 887 A    11/2000

* cited by examiner

*Primary Examiner*—Hung V Ngo
(74) *Attorney, Agent, or Firm*—Venable LLP; Robert Kinberg; Ryan M. Flandro

(57) ABSTRACT

A HF sealing strip (1) for electromagnetically shielded, insertable electronic modules comprises a core (2) of an elastically deformable material and a cover (3) of a flexible, conductive textile fabric. The cross section of the core (2) corresponds to an isosceles triangle with obtuse angle at the top. One section of the cover (3) forms a level contact surface (4), to which adhesive strips (7a; 7b; 8) are attached. In the region of the edges for the contact surface (4), the cover (3) of a textile fabric is used to form double-layer flaps (6a, 6b) without an elastic core. These flaps (6a, 6b) form reinforced, level outside edges of the HF sealing strip (1), which can thus better withstand shearing forces transverse to the contact surface (4).

18 Claims, 3 Drawing Sheets

HF SEALING STRIPS

CROSS REFERENCE TO RELATED APPLICATIONS

This application claims the priority of European Patent Application No. 05005343.8, filed Mar. 11, 2005.

BACKGROUND OF THE INVENTION

1. Field of the Invention

The invention relates to a high frequency (HF) sealing strip for electro-magnetically shielded, insertable electronic modules, said sealing strip comprising a core of at least partially elastically deformable material, a cover of a flexible and conductive material, in particular a non-woven material or textile fabric, which encloses the core and establishes an electrical connection between adjacent electronic modules and/or between a chassis for accommodating the electronic modules and an electronic module, as well as a contact surface formed by a section of the cover.

2. Related Art

Electronic devices configured with a modular-unit design consist of individual plug-in components or electronic modules, which are inserted into a sub-rack or chassis. The individual electronic modules are embodied such that they can be inserted or pulled out to facilitate the installation and/or or replacement, wherein these modules are inserted and removed in a direction perpendicular to the front of the electronic module, in depth direction. The modules are guided on the side by guide rails installed in the sub-rack and/or chassis.

When fully inserted, the front panel of the electronic module closes off the front of the sub-rack or chassis. The front panel frequently has a U-shaped cross section, with two side legs extending at a right angle from the front panel toward the back and toward the inside of the chassis or sub-rack. These legs extending toward the back function as contact surfaces for establishing an electrically conductive connection to the adjacent electronic modules or other chassis parts, thereby providing a good shielding to prevent high-frequency electromagnetic radiation (HF radiation) from entering and/or exiting. In some cases, the front panels are provided with legs angled toward the back along all four edges.

Special contacting elements are used to provide a tight HF seal for the unavoidable gaps between adjacent electronic modules. These special contacting elements can take the form of metal contact strips with spring elements or compressible seals of a conductive textile material.

Soft HF sealing strips of textile material have several advantages: They can be installed simply by attaching them to a level sealing surface, for example with the aid of adhesive tape sections, without having to use tools or any special skills. Endless webs of textile material can be produced relatively cheaply and can be cut on location into strips of a desired length. As compared to sharp-edged spring elements, textile seals are easy to handle and cannot cause injuries to persons or damage to the mechanical and electronic components.

Electro Magnetic Compatibility (EMC) profile seals with a core of foam material and a textile cover coated with a copper-nickel coating are known. These profile seals have a level contact surface for attaching them to a front panel and a curving bulge that projects away from the contact surface.

FIG. 6 in reference EP 1 052 887 A2 discloses a sealing strip, comprising a foam material core and a cover of a conductive fabric. In the region of one edge, the fabric for the cover forms a flap with an essentially U-shaped cross section. The foam material core is relatively thick as compared to the thickness of the cover fabric, even in the edge region.

The textile seal, Series 7000 Profile 74095, marketed by the company Chomerics, also comprises a foam core surrounded by a cover of a polyester material with nickel-copper coating. The elastically deformable foam core decreases in size toward the edges of the seal while the edges themselves are slightly rounded.

This known profile seal has a symmetrical cross section resembling a sinusoidal wave, wherein the thickness of the seal exceeds 1mm in the edge region already, with a total thickness of 3 mm.

As long as textile material seals are pressed only perpendicular against the surface to which they must adhere, they meet all requirements of a good and permanent HF seal. The problem arises when they are stressed by shearing forces acting in transverse direction upon the seal, meaning parallel to the gluing surface. If textile sealing strips are used between opposite-arranged sides of adjacent electronic modules, which can be inserted and pulled out, the danger exists that the resilient sealing strips are peeled off the adhering surface, in particular during the insertion of the modules, or that the sealing bulges are deformed excessively. Above all, cut edges of front panels or sharp corners can quickly damage or totally destroy sealing strips of textile material or can tear these off the background.

In recent years, demands have been voice for particularly thin textile seals which can be stressed by shearing forces acting parallel to the adhering surface. For example, the AMC standard (advanced mezzanine card specification) developed by the PICMG (PCI Industrial Computing Manufacture Group) for telecommunication applications requires a HF seal with a thickness only marginally above 2 mm in the non-stressed state.

SUMMARY OF THE INVENTION

The invention is consequently based on the technical problem of developing a HF sealing strip of textile material which has a reduced thickness and can be used for sealing particularly narrow gaps between two electronic modules. At the same time, the strip should also have a maximum resistance, especially against shearing forces introduced in transverse direction to the contact surface during the insertion and pulling out of an electronic module.

In order to solve this problem, we start with a HF sealing strip of the aforementioned type, meaning a strip having an at least partially deformable core and a cover of a flexible, electrically conductive material, wherein one section of the cover forms a contact surface. This object is solved by providing a double-layer flap of the cover material, formed at least along the insertion-side edge, wherein one layer is placed on top the other.

As a rule, the core is composed of a deformable, elastic material such as foam. However, the core can also be composed only in part of an elastic, deformable material and can be provided with a strengthening element that is inserted into the core, for example a wire.

Suitable as electrically conductive material is, for example, a non-woven material, a fabric and in particular a textile fabric, or any other flat material.

According to the invention, the elastically deformable core material does not extend completely to the edges of the HF sealing strip, but ends some distance before the edges, namely in front of the at least one flap of double-layer material. As a result, the edges can be very thin while simultaneously having a maximum strength owing to the two material layers which mutually reinforce each other. The minimum thickness of the edge zones therefore corresponds to twice the thickness of the cover material and is considerably thinner than that of traditional textile seals. As a result, more height is left for the sealing bulge while the ratio between the thickness of the HF seal in the non-stressed state and the thickness of the seal in the compressed state remains unchanged. It is furthermore a particular advantage that even with unfavorable tolerances during the insertion of an electronic module, its edge moving in transverse direction to the contact surface moves past the flap of double-layer material and only then pushes against the core region where the electronic module runs up onto one side of the sealing strip, meaning the material that forms the outside. In particular with narrow gap dimensions, the HF seal can thus be attached easily and/or a module can advance easily during the insertion.

The sealing strip is preferably provided on both sides with a double-layer flap, so as to facilitate the movement during the insertion as well as the pulling out of an electronic module.

As a rule, the flaps are created by folding over the textile fabric by 180° so that two layers of the textile fabric fit one against the other, in the manner of a fold. In special cases, however, an additional, thin reinforcing layer of a hard, solid material can be inserted between the two layers of the textile fabric, wherein the textile fabric is then fitted around the edges of the solid reinforcing material. A reinforcing layer of this type can be even thinner than the textile fabric, so that the region of the outside edges still has a minimum thickness, as compared to traditional textile seals.

The two layers of textile fabric which form the flaps in the edge region are preferably glued or welded together. If the glue is applied in a liquid form, for example as hot-melt glue or two-component glue, it penetrates the cavities between the fibers of the textile fabric and additionally reinforces and stabilizes the structure, following the cooling down and/or setting.

The core of elastically deformable material preferably has a cross section in the form of a triangle with uneven sides, wherein the short sides of the triangle define the slanted run-up surfaces on the sealing bulge and the long side defines the level contact surface, positioned opposite the angle shown in the drawing on the top. An angle between 80° and 160° has proven effective, which results in a relatively flat seal in the shape of a roof, wherein the angle preferably measures approximately 140°. A triangular cross sectional form of this type avoids unnecessary forces because of the lowest possible material displacement and/or deformation during the insertion or pulling out of the module. The essentially level embodiment of the moderately slanted run-up surfaces prevents the formation of an excessive bulge when the edge of an electronic module makes contact and is pushed in transverse direction to the contact surface. The edge regions of the HF sealing strip according to the invention, which are particularly stable and rigid because of the flap formation, support the slanted run-up surfaces and keep these taut.

Foamed synthetic material such as polyurethane foam has proven itself as material for the core. The textile fabric for the cover consists, for example, of polyester fibers made conductive through metallization or by coating them with nickel and copper. It is understood and is known per se that a plurality of metals can be used for the metallization or the coating, for example also gold and silver.

Attaching the HF sealing strip to the sealing surface of an electronic module is best accomplished with the aid of adhesive tape sections affixed to the contact surface of the sealing strip. A particularly good adherence to the background is achieved if respectively one adhesive tape section is arranged in each flap region. The center region of the contact surface can remain exposed to ensure a non-problematic contacting with the metal sealing surface of the electronic module. Owing to the fact that the HF sealing strip is provided with an essentially elastic core, the HF sealing strip is compressed in the inserted state, thereby causing the contact surface to bend in the direction toward the electronic module on which it rests, so as to fit flush against the electronic module, at least in the center portion. Since the outer edges of the flaps are designed to be rather sharp-edged, the adhesive strips can extend right up to the edges of the contact surface and result in a particularly high stability under load to prevent the seal from separating from the background.

According to one advantageous and useful embodiment of the invention, a total of three parallel sealing strips can be attached to the contact surface, wherein the adhesive strip in the center is made of a conductive material. In that case, the adhesive strip in the center functions to establish the electrical contact between the HF sealing strip and the sealing surface of the electronic module while the two adhesive strips on the side have maximum adhering forces. Technology teaches that a non-conductive adhesive has more adhering force than an electrically conductive adhesive. Thus, by combining conductive and non-conductive adhesive strips, the total adhering force on the contact surface can be increased considerably as compared to using only two outer adhesive strips and leaving the center region exposed.

BRIEF DESCRIPTION OF THE DRAWINGS

An exemplary embodiment of the invention is explained in further detail in the following with the aid of the enclosed drawings, which show in.

DETAILED DESCRIPTION OF THE SEVERAL EMBODIMENTS OF THE INVENTION

Figure 1:
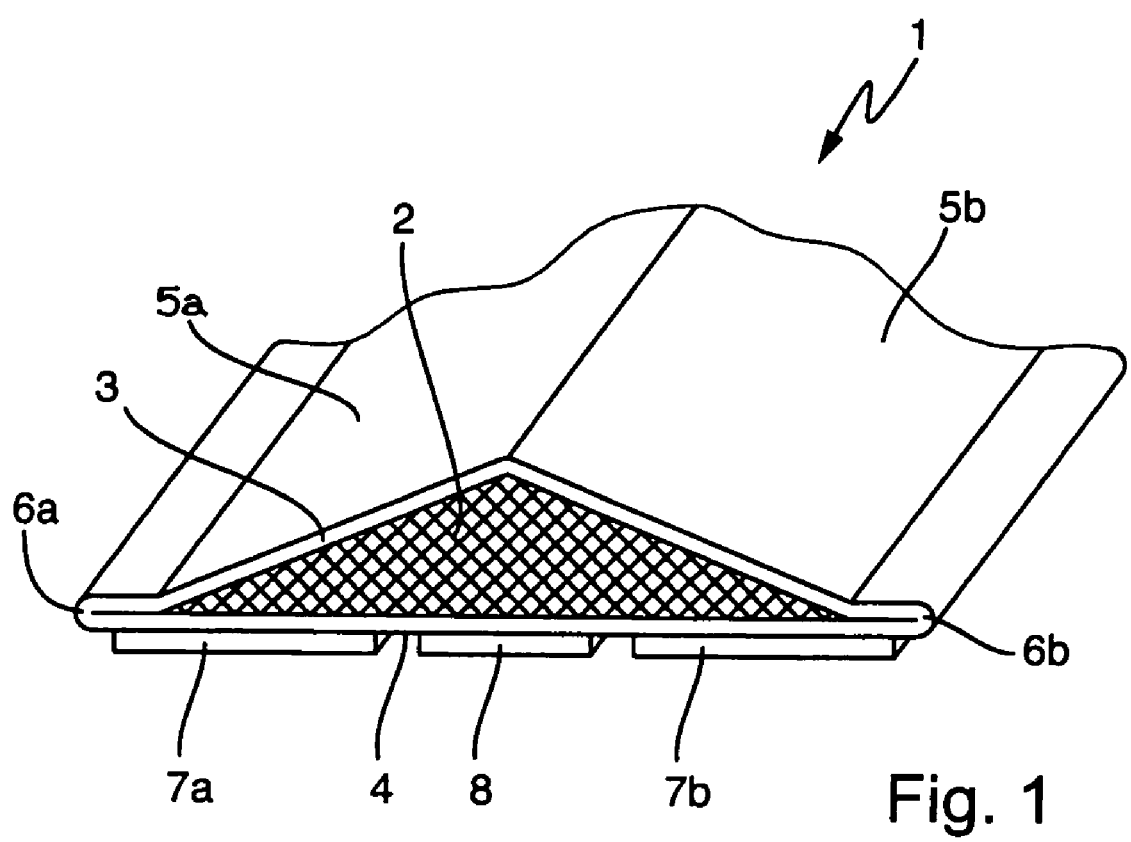
FIG. 1 An enlarged perspective view from the front of a HF sealing strip.

The HF sealing strip 1, shown in FIG. 1, includes an elastically deformable core 2 and a cover 3 of a flexible, metallized textile fabric. The material used for the core 2 is a synthetic foam material, e.g. polyurethane foam. The cover 3, which can also be seamless, is made from a polyester fabric. To achieve a sufficient electrical conductivity, the fabric is metallized or coated with layers of nickel or copper. The textile fabric for the cover 3 thus has a shielding effect of 60-70 dB, for example, for electromagnetic waves in the range of 2 GHz.

The flexible core 2 has the cross-sectional shape of an isosceles triangle, wherein the upper angle measures approximately 140°. The cover 3 in principle also has a triangular cross section, with the section positioned opposite the upper angle forming a level contact surface. The sections corresponding to the other two sides of the triangle form slanted, level run-up surfaces 5a, 5b. In the region of the right and the left edge of the contact surface 4, the textile fabric for the cover 3 is folded over by 180°, thereby forming horizontally outward extending flaps 6a, 6b. Two layers of the textile fabric are glued together in the region of these flaps 6a and/or 6b. The flaps 6a and 6b consequently form thin edge regions of the HF sealing strip, wherein the undersides continue the level contact surface 4.

Two parallel outer adhesive strips are attached to the contact surface 4, wherein these strips extend into the region of the flaps 6a, 6b and end just before reaching the outer edges. An additional adhesive strip 8 of a conductive material is arranged in the center between the adhesive strips 7a, 7b.

Figure 2A:
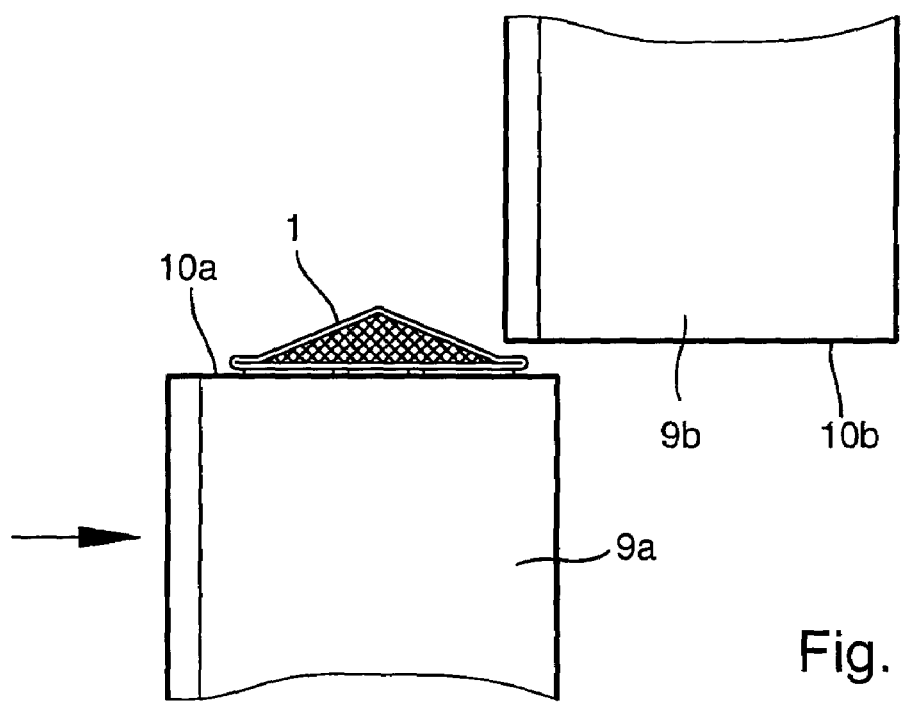
FIG. 2a A simplified representation of a HF sealing strip according to FIG. 1 when it is used in a gap between two electronic modules, wherein the lower electronic module is in the process of being inserted.
Figure 2B:
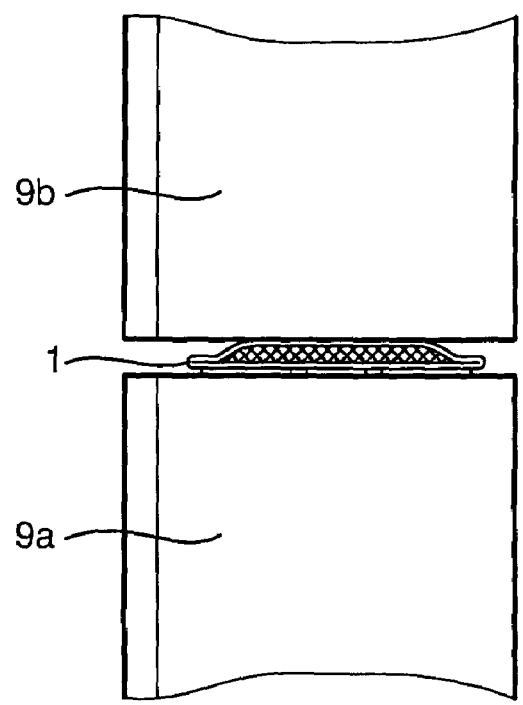
FIG. 2b The configuration as shown in FIG. 2a, with completely inserted lower electronic module and compressed HF sealing strip.

The configuration shown in FIGS. 2a and 2b comprises two electromagnetically shielded electronic modules 9a and 9b, arranged one above the other.

In FIG. 2a, the lower electronic module 9a is in the process of being inserted in horizontal direction from the left to the right while the above-arranged electronic module 9b is already in the inserted position. The electronic module 9a has a level sealing surface 10a on the top while the opposite-arranged upper electronic module 9b is provided on the underside with a corresponding sealing surface 10b.

A HF sealing strip 1 of the above-described type is glued to the sealing surface 10a for the lower electronic module 9a. In the non-stressed state, for example, this sealing strip has a width of 10 mm and a height of 2.3 mm. The gap to be sealed between the adjacent electronic modules 9a and 9b is approximately 1 mm. The lower electronic module 9a has already been inserted far enough so that the lower front corner of the upper electronic module 9b is positioned immediately in front of the HF sealing strip 1.

FIG. 2b shows the lower electronic module 9a completely inserted, so that it is aligned with the above-positioned electronic module 9b. The HF sealing strip 1 is compressed, which reduces its height to the dimensions of the gap between the two electronic modules 9a and 9b, meaning to approximately 1 mm. The gap between the two electronic modules 9a and 9b is thus sealed while an electrically conductive connection is simultaneously created by means of the HF sealing strip 1.

Figure 3:
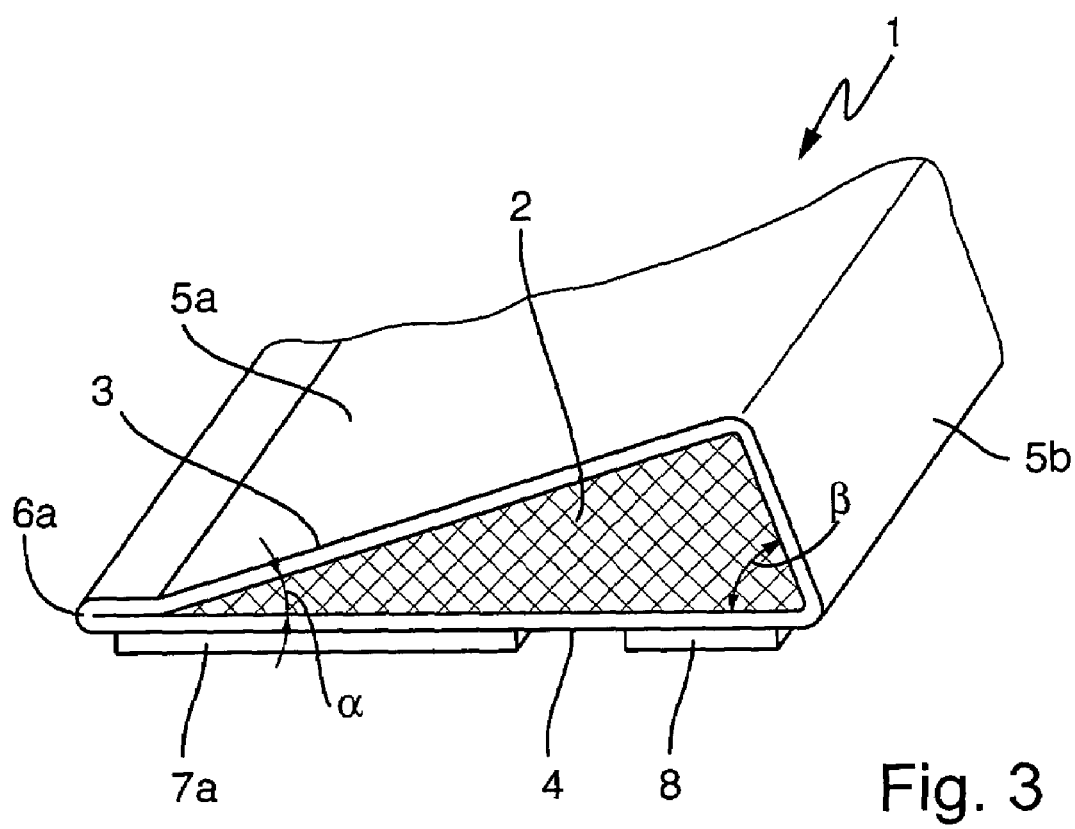
FIG. 3 A different embodiment of a HF sealing strip, shown in an enlarged view from the front.

The HF sealing strip 1 for a different exemplary embodiment (FIG. 3) is provided with only one flap 6a on the module-insertion side. The HF sealing strip 1 furthermore has an acute angle α between the contact surface 4 and the run-up surface 5a, wherein this angle preferably measures between 5° and 30°, but can also be larger. An angle β is present, for example, on the side where the HF sealing strip 1 is pulled out of the electronic module, which is much larger than the angle α and can measure up to 90°. For this exemplary embodiment, the surface 5b does not form a run-up surface.

COMPILATION OF REFERENCE NUMBERS

1 HF sealing strip
2 core
3 cover
4 contact surface
5a,5b run-up surfaces
6a,6b flaps
7a,7b outer adhesive strips (on 4)
8 center adhesive strip (on 4)
9a,9b electronic module
10a,10b sealing surfaces (of 9a, 9b)

The invention claimed is:

1. A HF sealing strip for insertable, electromagnetically shielded electronic modules, said sealing strip comprising:
a core of a material that is at least in part elastically deformable;
a cover enclosing the core, the cover being made of a flexible, conductive material and adapted to establish an electrical connection between adjacent electronic modules and/or between a chassis for accommodating electronic modules and an electronic module, wherein a section of the cover forms a contact surface and the cover further forms at least one horizontally outward extending double-layer flap in a region of the contact surface on at least a module-insertion side, and wherein the at least one flap is formed by two layers of the cover material fitting against one another.

2. The HF sealing strip according to claim 1, wherein the two layers of the flap are glued or welded together.

3. The HF sealing strip according to claim 1, wherein a cross section of the core is in the shape of an isosceles triangle.

4. The HF sealing strip according to claim 3, wherein an angle between a pair of slanted run-up surfaces opposite the contact surface measures between 80° and 160°.

5. The HF sealing strip according to claim 4, wherein the angle is approximately 140°.

6. The HF sealing strip according to claim 1, wherein the core is composed of foamed synthetic material.

7. The HF sealing strip according to claim 1, wherein the cover is metallized.

8. The HF sealing strip according to claim 1, further comprising at least one adhesive strip attached to the contact surface.

9. The HF sealing strip according to claim 8, wherein the adhesive strip is arranged in a region of the at least one flap.

10. The HF sealing strip according to claim 8, further comprising a conductive adhesive strip arranged in a center of the contact surface between two outer adhesive strips.

11. The HF sealing strip according to claim 1, wherein a cross section of the core takes the form of a triangle with unequal sides, wherein at least one of the short sides defines a slanted run-up surface and wherein the long side is adjacent to the section of the cover defining the contact surface.

12. The HF sealing strip according to claim 11, wherein the run-up surface on the module-insertion side and the contact surface jointly form an acute angle of no more than 45°.

13. The HF sealing strip according to claim 12, wherein the acute angle is less than approximately 30°.

14. The HF sealing strip according to claim 1, wherein the flexible, conductive material comprises a non-woven material or textile fabric.

15. A HF sealing strip for insertable, electromagnetically shielded electronic modules, said sealing strip comprising:
a core of a material that is at least in part elastically deformable;
a cover enclosing the core, the cover being made of a flexible, conductive material and adapted to establish an electrical connection between adjacent electronic modules and/or between a chassis for accommodating electronic modules and an electronic module, wherein a section of the cover forms a contact surface and the cover further forms at least one double-layer flap in a region of the contact surface on at least a module-insertion side, and wherein the at least one flap is formed by two layers of the cover material fitting against one another, and wherein a cross section of the core takes the form of a triangle with unequal sides, wherein at least one of the short sides defines a slanted run-up surface and wherein the long side is adjacent to the section of the cover defining the contact surface.

16. The HF sealing strip according to claim 15, wherein the run-up surface on the module-insertion side and the contact surface jointly form an acute angle of no more than 45°.

17. The HF sealing strip according to claim 16, wherein the acute angle is less than approximately 30°.

18. The HF sealing strip according to claim 15, wherein the flexible, conductive material comprises a non-woven material or textile fabric.

* * * * *